United States Patent
Strehlow et al.

(10) Patent No.: US 9,759,739 B2
(45) Date of Patent: Sep. 12, 2017

(54) MEMS VIBRATING-BEAM ACCELEROMETER WITH PIEZOELECTRIC DRIVE

(75) Inventors: John Strehlow, Mukilteo, WA (US); Doug MacGugan, Bellevue, WA (US)

(73) Assignee: Honeywell International Inc., Morris Plains, NJ (US)

( * ) Notice: Subject to any disclaimer, the term of this patent is extended or adjusted under 35 U.S.C. 154(b) by 1378 days.

(21) Appl. No.: 13/019,913

(22) Filed: Feb. 2, 2011

(65) Prior Publication Data

US 2012/0192649 A1 Aug. 2, 2012

(51) Int. Cl.
| G01C 19/00 | (2013.01) |
| G01P 15/097 | (2006.01) |
| G01L 1/16 | (2006.01) |
| H03H 9/24 | (2006.01) |
| H03H 9/02 | (2006.01) |

(52) U.S. Cl.
CPC ............ G01P 15/097 (2013.01); G01L 1/162 (2013.01); H03H 9/2473 (2013.01); *H03H 9/02259* (2013.01); *H03H 2009/02496* (2013.01)

(58) Field of Classification Search
CPC . G01L 1/16; G01P 15/097; G01P 9/04; H03H 9/02; H03H 9/15; H03H 9/2473; G01C 19/00
USPC ........ 73/504.16, 503.3, 504.12, 509, 514.02, 73/514.34
See application file for complete search history.

(56) References Cited

U.S. PATENT DOCUMENTS

| 3,672,220 | A | | 6/1972 | Agar |
| 4,469,979 | A | | 9/1984 | Chuang |
| 5,442,146 | A | * | 8/1995 | Bell et al. ............... 177/210 FP |
| 5,574,220 | A | | 11/1996 | Amand et al. |
| 6,701,785 | B2 | * | 3/2004 | Knowles et al. .......... 73/504.16 |
| 6,874,363 | B1 | | 4/2005 | Foote et al. |
| 7,050,271 | B2 | | 5/2006 | Miyano et al. |
| 7,379,629 | B1 | * | 5/2008 | Burns ............................ 385/12 |

(Continued)

FOREIGN PATENT DOCUMENTS

| EP | 0696728 A1 | 2/1996 |
| EP | 1235074 A1 | 8/2002 |

(Continued)

OTHER PUBLICATIONS

Chen et al., An Electromagnetically Excited Silicon Nitride Beam Resonant Accelerometer; Sensors 2009, 1330-1338; doi:10.3390/s90301330; Published Feb. 26, 2009; Institute of Electronics, Chinese Academy of Sciences, Sate Key Laboratories of Transducer Technology, Beijing, P.R. China.

(Continued)

*Primary Examiner* — Laura Martin
*Assistant Examiner* — Samir M Shah
(74) *Attorney, Agent, or Firm* — Shumaker & Sieffert, P.A.

(57) ABSTRACT

A high-temperature drive component for a double-ended tuning fork (DETF). The drive component attaches to a surface of at least one of the tines. The drive component includes at least one piezoelectric trace sandwiched at least partially between two electrical traces. At least one of the tines includes a doped silicon base with drive component located thereon. One of the electrical traces is electrically connected to the doped silicon base and the other is electrically isolated from the doped silicon base.

7 Claims, 4 Drawing Sheets

(56) References Cited

U.S. PATENT DOCUMENTS

| | | | | |
|---|---|---|---|---|
| 7,443,509 B1* | 10/2008 | Burns | | 356/480 |
| 7,523,537 B1* | 4/2009 | Knowles et al. | | 29/594 |
| 7,605,391 B2* | 10/2009 | Burns | | 257/21 |
| 7,677,105 B2 | 3/2010 | Ishii | | |
| 7,770,275 B2 | 8/2010 | Takahashi | | |
| 7,802,475 B2 | 9/2010 | Nishizawa et al. | | |
| 7,990,232 B1* | 8/2011 | Lee | | 333/186 |
| 8,091,431 B2* | 1/2012 | Motoyama | | 73/717 |
| 8,096,187 B2* | 1/2012 | Sato | | 73/717 |
| 2002/0021059 A1* | 2/2002 | Knowles et al. | | 310/370 |
| 2002/0152812 A1* | 10/2002 | Featonby et al. | | 73/504.12 |
| 2006/0196273 A1* | 9/2006 | Burns | | 73/702 |
| 2008/0087083 A1 | 4/2008 | Nishizawa et al. | | |
| 2009/0151461 A1 | 6/2009 | Ishii | | |
| 2010/0000322 A1* | 1/2010 | Honda et al. | | 73/504.16 |
| 2010/0043548 A1 | 2/2010 | Ashimori | | |
| 2011/0173787 A1* | 7/2011 | Ono et al. | | 29/25.35 |
| 2011/0174075 A1* | 7/2011 | Watanabe et al. | | 73/514.34 |
| 2011/0234206 A1* | 9/2011 | Kawakubo et al. | | 324/162 |

FOREIGN PATENT DOCUMENTS

| | | | | |
|---|---|---|---|---|
| EP | 1930709 A1 * | 6/2008 | | G01L 1/16 |
| JP | 2004193574 A | 7/2004 | | |
| JP | 2008209388 A | 9/2008 | | |

OTHER PUBLICATIONS

Deyong Chen, et al.; An Electromagnetically Excited Silicon Nitride Beam Resonant Accelerometer, Open Access sensors, ISSN 1424-8220, www.mdpi.com/journal/sensors; Sensors 2009, 9, 1330-1338; doi: 10.3390/s90301330.

Notice of Intent to Grant from counterpart European Application 11191229.1, dated Aug. 19, 2013, 23 pp.

Search Report from counterpart European application No. 11191229.1, dated May 31, 2012, 3 pp.

Examination Report from counterpart European application No. 11191229.1, dated Jul. 16, 2012, 6 pp.

Response to Examination Report dated Jul. 16, 2012, from counterpart European Application No. 1191229.1, filed Nov. 2, 2012, 15 pp.

Examination Report from counterpart European application No. 11191229.1, dated Jan. 7, 2013, 6 pp.

Response to Examination Report dated Jan. 7, 2013, from counterpart European Application No. 11191229.1, filed Jun. 28, 2013, 11 pp.

Notification of Reasons for Refusal, and translation thereof, from counterpart Japanese Application No. 2011-262232, mailed Sep. 7, 2015, 4 pp.

\* cited by examiner

MEMS VIBRATING-BEAM ACCELEROMETER WITH PIEZOELECTRIC DRIVE

GOVERNMENT INTEREST

The invention described herein was made in the performance of work under U.S. Government Contract No. DE-EE0002754, awarded by Department of Energy. The Government may have rights to portions of this invention.

BACKGROUND OF THE INVENTION

Accelerometers are used in down-hole drilling operations, e.g., oil, gas and geothermal, to navigate the drill in off-vertical directions. Because of the depths involved, the operating temperature for these accelerometers is very high and can exceed 200° C. for oil and gas drilling and can reach 300° C. for geothermal drilling. Developing drive mechanisms for accelerometers that can operate between 200° C. and 300° C. with the required performance is difficult. Microelectro-Mechanical Systems (MEMS) vibrating-beam devices offer the accuracy and stability at high temperature that are needed but, because of the damping requirement, operation of these devices using electro-static means requires high-voltage electrostatic comb drives. Typically, the voltage necessary can reach 200V. The electronics needed to achieve this high voltage are not reliable within this high-temperature environment.

SUMMARY OF THE INVENTION

The present invention provides high-temperature drive and sense mechanisms for double-ended tuning fork (DETF). The DETF includes first and second tines attached at their ends and a drive component attached to at least one surface of at least one of the tines. The drive component includes at least one piezoelectric trace and at least one electrical trace. The tines include a doped silicon base with the at least one piezoelectric trace located between a pair of electrical traces. One of the pair of electrical traces is electrically connected to or includes the doped silicon base and the other electrical trace is electrically isolated from the doped silicon base.

The DETF may be utilized in various devices such as a vibrating-beam accelerometer (VBA), a pressure sensor, or other devices where driven resonant tines are desired.

BRIEF DESCRIPTION OF THE DRAWINGS

Preferred and alternative embodiments of the present invention are described in detail below with reference to the following drawings.

DETAILED DESCRIPTION OF THE INVENTION

Figure 1:
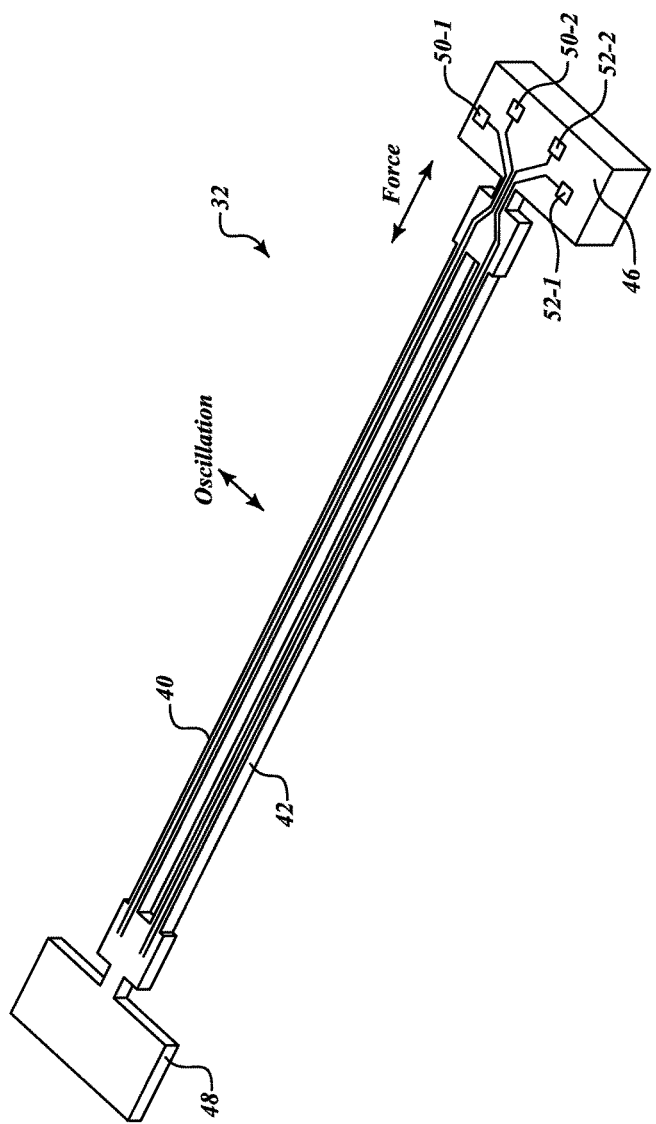
FIG. 1 illustrates a perspective view of an example of one of the double-ended tuning forks used in the accelerometer of FIG. 1.

FIG. 1 illustrates an exemplary DETF 32 that includes first and second base sections 46, 48 and a pair of silicon-based tines 40, 42 attached between the two bases 46, 48. In this embodiment, the first tine 42 includes a drive component having a piezoelectric material and electrodes (i.e., electrical traces) that electrically connect to electrical pads 52-1 and 52-2 located on the first base section 46. The second tine 40 includes a sense component that includes a piezoelectric material and electrodes. The electrodes on the second tine 40 are connected to sense electrode pads 50-1 and 50-2 located on the base section 46.

A voltage is applied across drive component electrical traces to generate a drive force on the tine 42. The piezoelectric material of the drive component is thin-film deposited and bonded directly to the tine 42 in a specific pattern on the surface of the tine 42. The sense component is similarly constructed. Electrical traces adjacent to the piezoelectric material apply a drive voltage on the order of ±10V or less. This lower voltage is an advantage for the design of high-temperature electronics (e.g., an oscillator circuit implemented with silicon-on-oxide (SOI) components). The drive voltage changes the shape of the piezoelectric material, which, in turn, causes a strain-induced load on the tine 42 causing vibration. By proper patterning of the piezoelectric material on the silicon beam (i.e., the tine 42) and application of drive voltage, a resonance vibration of the beam is established.

Control electronics (not shown) sense the resonant strain of the vibrating silicon beam by way of a change of voltage across the piezoelectric material of the sense component. Based on the sensed change of voltage across the piezoelectric sense component via the associated electrodes, the control electronics provide a drive signal to the patterned piezoelectric thin-film material of the drive component in order to maintain beam vibration at the resonant frequency.

Forces applied to one of the bases 46, 48 influence the resonant frequency of the vibrating silicon beam (the tines 40, 42), either increasing or decreasing the frequency of oscillation. The control electronics track this change in resonant frequency, thus providing a direct measure of the strain induced into the silicon beam by the applied force.

The drive voltage applied across the piezoelectric trace(s) via the electrical traces is a periodic time function that causes the beam (i.e., the tines 40, 42) to vibrate at its fundamental mode. In one embodiment, the sense piezoelectric trace(s) provide a sense voltage via the electrical leads that is a sinusoidal time function representing the vibrating frequency of the beam. This sense voltage is used by the control electronics to generate the drive voltage with the appropriate gain and phase to maintain the fundamental vibration mode of the beam. Axial loads experienced by the DETFs cause the fundamental frequency to increase for one DETF and to decrease for the other DETF.

Control electronics generate drive voltage time function(s) for the drive piezoelectric traces. This voltage function varies periodically between two voltages that are above and below the ground or mid-voltage of the beam or the electrical leads that are connected to the beam (tine). This creates a differential voltage relative to this ground or mid-voltage that has plus (+) or minus (−) peaks of the same magnitude. The piezoelectric trace then expands and contracts normal to the surface of the beam and inversely the trace contracts and expands parallel to the surface of the beam based on the piezoelectric effect and the differential voltage applied via the electrical leads. This parallel expansion and contraction of the piezoelectric trace causes axial strain on the beam. When the trace is offset laterally from the longitudinal bending neutral axis of the beam this axial strain causes the beam to bend. Varying the voltage applied to the piezoelectric trace in a periodic manner causes the beam to vibrate. The beam vibration also causes strain on the sense piezoelectric trace(s) parallel to the surface of the beam and again through the piezoelectric effects they provide a sense voltage via the electrical leads. The sense voltage is a sinusoidal time function representing the vibrating frequency of the beam and is used by the control electronics to generate the drive voltage with the appropriate gain and phase to maintain the fundamental vibration mode of the beam.

Figure 2:
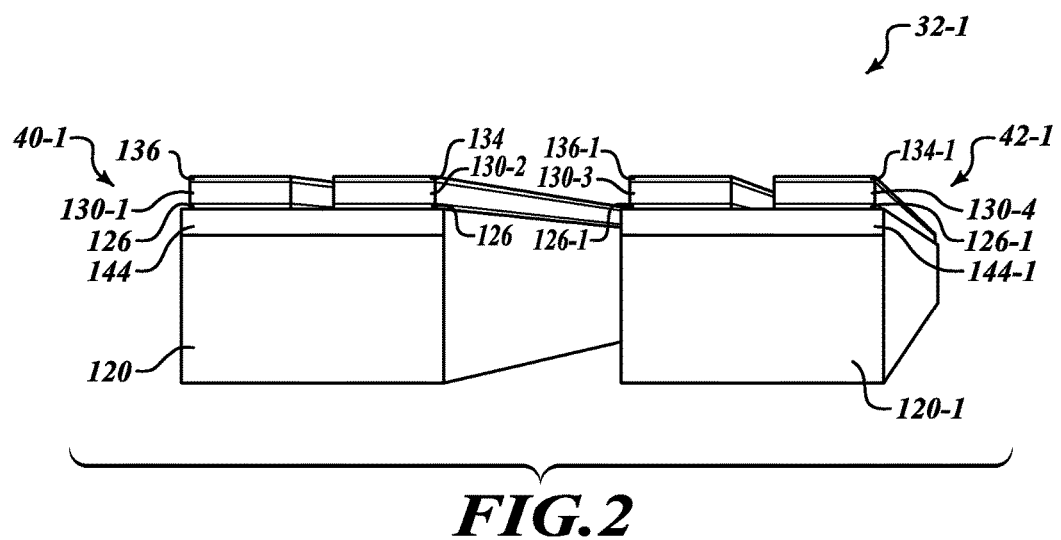
FIG. 2 illustrates a perspective cross-sectional view of an exemplary pair of tines of a double-ended tuning fork formed in accordance with an embodiment of the present invention.
Figure 3:
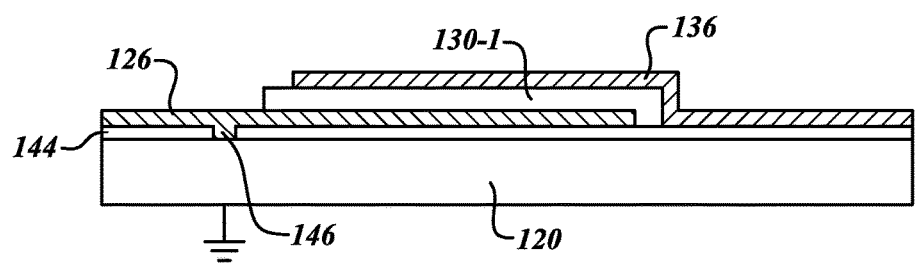
FIG. 3 illustrates a side cross-sectional view of an exemplary tine used in the double-ended tuning fork of FIG. 1.
Figure 4:
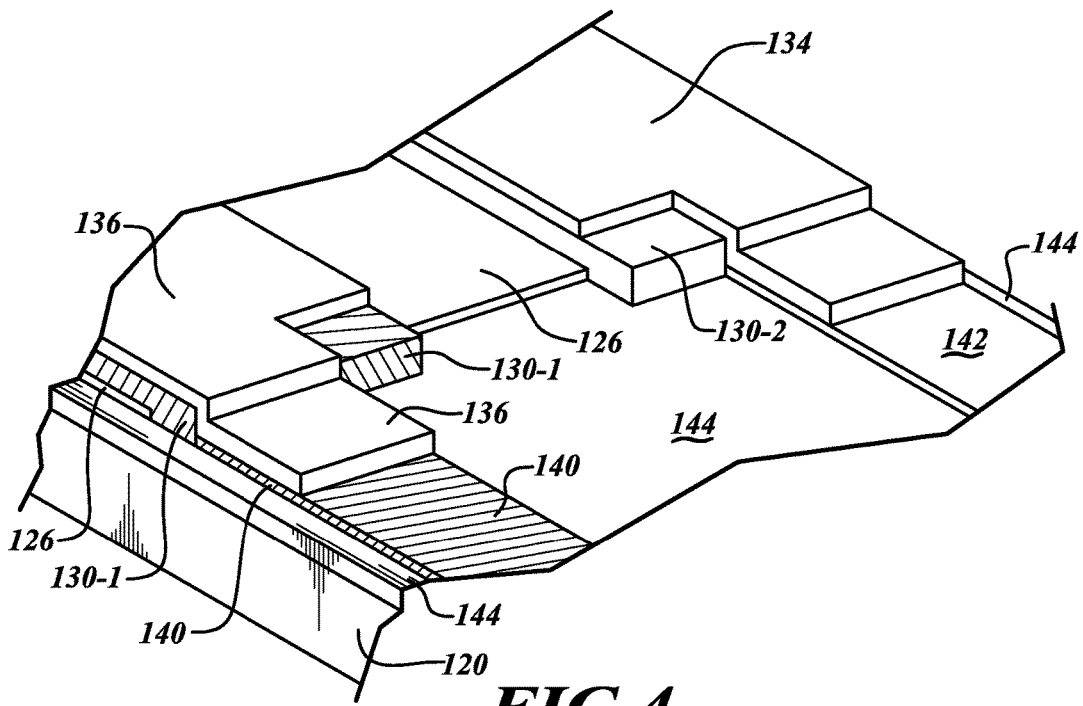
FIG. 4 illustrates an exemplary pattern of materials on a tine formed in accordance with an embodiment of the present invention.

FIGS. 2-4 illustrate various views of an exemplary pattern of electrical traces and piezoelectric material on tines 40-1, 42-1 of a DETF 32-1. The first tine 40-1 includes a doped silicon base 120 that is covered on most or all of a top surface (having a normal perpendicular to direction of oscillation) with an insulation layer 144 (e.g., Si silicon dioxide ($SiO_2$), aluminum trioxide ($Al2O_3$), tantalum pentoxide ($Ta2O_5$), silicon nitride ($Si_3N_4$)). On top of a portion of the insulation layer 144 is a lower electrode layer 126 (e.g., Molybdenum (Mo), Chromium (Cr)+Mo, Cr+platinum (Pt)). Other electrode materials may be used.

Two piezoelectric traces 130-1, 130-2 are applied side-by-side over the lower electrode layer 126. An example material used for the two piezoelectric traces 130-1, 130-2 is Aluminum Nitride (AlN). Top electrode layers 136, 134 are applied over the piezoelectric traces 130-1, 130-2. The top electrode layers 136, 134 are similar to the lower electrode layer 126. The second tine 42-1 includes an insulation layer 144-1, lower and upper electrode layers 126-1, 136-1, 134-1, and piezoelectric traces 130-3, 130-4 as that on the first tine 40-1.

The insulation layers, the electrode layers and the piezoelectric traces are applied and bonded using compatible MicroElectro-Mechanical Systems (MEMS) deposition processes, such as sputter or vapor deposition. Some or all of the layers are etched also according to compatible MEMS processes.

As shown in FIG. 3, the lower electrode layer 126 (126-1) is electrically connected to the doped silicon base 120 by way of a metalized via 146 that passed through the insulation layers. The upper electrode layers attach to traces 140, 142 as shown in FIG. 4 that are bonded to the insulation layer 144 and are isolated from the lower electrode layers 126, 126-1 by the piezoelectric traces 130-1, 130-2. Pads located at a base section of the DETF are similarly constructed. A first pad (not shown) connects to a lead or trace directly connected to the top electrode layer 136. The first pad is electrically isolated from the doped silicon base 120 at the base section of the DETF. A second pad is electrically isolated from the first pad and is electrically connected to the doped silicon base 120 most likely by way of a via through the insulation layer 144.

In one embodiment, first and second piezoelectric traces (one being a drive trace, the other a sense trace) are placed on one tine surface of the DETF, as shown in FIG. 2 or on only one tine.

In another embodiment, the piezoelectric traces are mounted on the side of the silicon beam(s) instead of the top surface.

Figure 5:
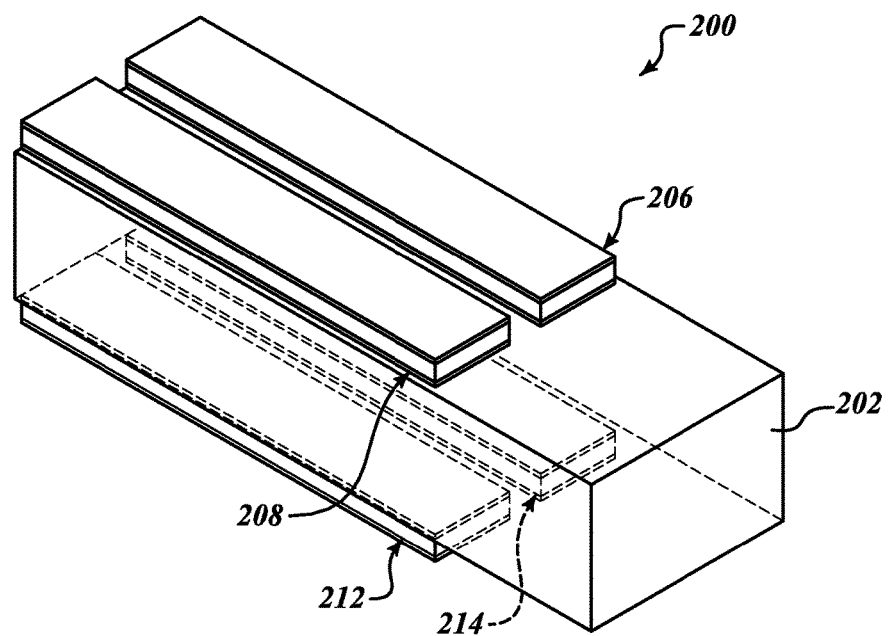
FIG. 5 illustrates a perspective view of a portion of an exemplary tine formed in accordance with an embodiment of the present invention.

In another embodiment, as shown in FIG. 5, a tine 202 for a DETF 200 includes two piezoelectric-electrode sandwich traces 206, 208 that are deposited on the top surface and two piezoelectric-electrode sandwich traces 212, 214 that are deposited on the bottom surface of the tine 202. The four sandwich traces 206, 208, 212, 214 can be used as sense or drive components in any number of different ways. For example, the traces 206, 212 function as the drive components and the traces 208, 214 function as the sense components.

Figure 6:
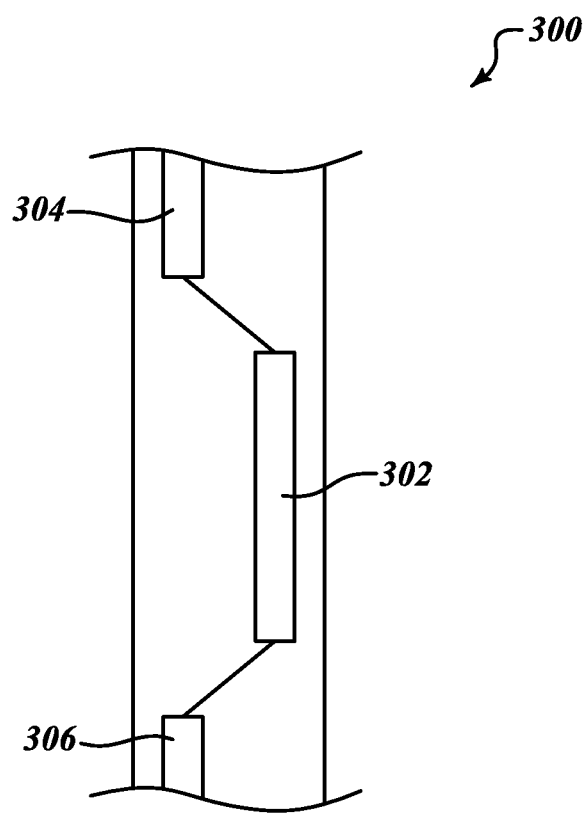
FIG. 6 illustrates at top view of an exemplary trace pattern formed in accordance with an embodiment of the present invention.

In another embodiment, as shown in FIG. 6, the drive component (piezoelectric material and electrical traces) includes a first sandwich of piezoelectric material within two electrodes that is located at one side of a middle section of a tine 300 of a DETF. Second and third sandwiches 304, 306 of piezoelectric material within electrodes are located on the opposite side of the tine 300 near the ends of the tine 300. The electrodes of the sandwiches are connected via leads on the tine 300. A configuration such as this provides tension forces in the tine 300 so that the tine 300 will deflect laterally in plane. A second drive similar to the one shown may be included on the tine 300 but in opposing locations on the surface of the tine 300 or on the opposing tine (not shown) of the DETF.

In another embodiment, the sense component may be devices other than a piezoelectric device. For example, the sense component may include piezoresistive devices, comb capacitor devices, or simple capacitor devices or other devices that can sense motion of the DETF tines.

While the preferred embodiment of the invention has been illustrated and described, as noted above, many changes can be made without departing from the spirit and scope of the invention. Accordingly, the scope of the invention is not limited by the disclosure of the preferred embodiment. Instead, the invention should be determined entirely by reference to the claims that follow.

The embodiments of the invention in which an exclusive property or privilege is claimed are defined as follows:

1. A double-ended tuning fork (DETF) device comprising:
a first base;
a second base;
first and second tines attached to the first base at a first end and to the second base at a second end, the first and second tines lying in a plane; and
a drive component attached to a top surface of at least the first tine and offset laterally from a longitudinal bending neutral axis of the first tine, wherein the drive component is configured to cause the tines to oscillate in the plane, wherein the drive component comprises:
a first subcomponent including at least a first piezoelectric drive trace and at least a first electrical drive trace, wherein the first subcomponent is located on a middle section of the first tine and is offset laterally from the longitudinal bending neutral axis of the first tine; and
a second subcomponent including at least a second piezoelectric drive trace and at least a second electrical drive trace, wherein the second subcomponent is located between the middle section of the first tine and the first end of the first tine and is offset laterally from the longitudinal bending neutral axis of the first tine opposite that of the first subcomponent,
wherein the electrical drive traces of the first and second subcomponents are electrically connected.

2. The device of claim 1,
wherein the first and second tines each comprise a doped silicon base,
wherein the second subcomponent further includes a third electrical drive trace,
wherein the second piezoelectric drive trace is located between the second and third electrical drive traces, and
wherein the second electrical drive trace is electrically connected to the doped silicon base and the third electrical drive trace is electrically isolated from the doped silicon base.

3. The device of claim 1, wherein the drive component is located on both the first and second tines.

4. The device of claim 1, further comprising a sense component attached to at least one surface of the second tine and offset laterally from a longitudinal bending neutral axis of the second tine, wherein the sense component comprises:
at least one piezoelectric sense trace; and
at least one electrical sense trace.

5. The device of claim 4, further comprising a controller configured to:
apply a voltage across the first piezoelectric drive trace and the second piezoelectric drive trace of the drive component via the first electrical drive trace and the second electrical drive trace of the drive component;
receive a sense signal from the sense component, wherein the sense signal is associated with motion of the first and second tines; and
alter the voltage applied across the first piezoelectric drive trace and the second piezoelectric drive trace of the drive component based on the received sense signal to drive the first and second tines to oscillate at a resonant frequency of the first and second tines.

6. The device of claim 1, wherein the first piezoelectric drive trace and the second piezoelectric drive trace are bonded directly to the top surface of the first tine.

7. The device of claim 1,
wherein the first tine comprises a silicon beam,
wherein the first piezoelectric drive trace and the second piezoelectric drive trace are configured to expand and contract relative to the silicon beam, and
wherein the expansion and contraction of the first piezoelectric drive trace and the second piezoelectric drive trace causes the silicon beam to bend.

* * * * *